(12) United States Patent
Head

(10) Patent No.: US 8,207,871 B2
(45) Date of Patent: Jun. 26, 2012

(54) EXPRESS COOK FEATURE

(75) Inventor: Jesse Spalding Head, Louisville, KY (US)

(73) Assignee: General Electric Company, Schenectady, NY (US)

( * ) Notice: Subject to any disclaimer, the term of this patent is extended or adjusted under 35 U.S.C. 154(b) by 859 days.

(21) Appl. No.: 12/260,148

(22) Filed: Oct. 29, 2008

(65) Prior Publication Data
US 2010/0102995 A1    Apr. 29, 2010

(51) Int. Cl.
*H03M 11/00*    (2006.01)
(52) U.S. Cl. ......................................... 341/22
(58) Field of Classification Search .............. 341/22; 291/620
See application file for complete search history.

(56) References Cited

U.S. PATENT DOCUMENTS

| | | | |
|---|---|---|---|
| 4,162,381 A * | 7/1979 | Buck | 219/705 |
| 4,343,990 A * | 8/1982 | Ueda | 219/492 |
| 5,530,230 A * | 6/1996 | Smith et al. | 219/723 |
| 6,252,206 B1 | 6/2001 | Leukhardt | |
| 6,333,492 B1 | 12/2001 | Graves | |
| 6,532,195 B1 | 3/2003 | Head | |
| 7,126,088 B2 | 10/2006 | Horton | |
| 2003/0024925 A1 * | 2/2003 | Graves et al. | 219/681 |

OTHER PUBLICATIONS

2004 Matsushita Electric Industrial Co., Ltd; Service manual Commercial Microwave Oven.*
Emerson 900W Microwave Oven owner manual Mw8999rd/sb.*
Panasonic Manuel for moder :nn-h735/h765/H965 (2005).*
Emerson MW8999Sb microwave Oven Spec; Sep. 2, 2008.*

* cited by examiner

*Primary Examiner* — Rexford Barnie
*Assistant Examiner* — Angela Brooks
(74) *Attorney, Agent, or Firm* — Fay Sharpe LLP; Karl W. Hauber

(57) ABSTRACT

A method and apparatus for controlling a cooking apparatus is provided including a microprocessor responsive to a set of user actuable keypads. The control comprises a numeric selector for initiating a cook time duration in minutes corresponding to the numeric selector with a first press. The same numeric selector can add (x) time in seconds to the cook time duration with a second press. And any numeric selector can then add ½ (x) time in seconds to the cook time duration with a third press.

11 Claims, 2 Drawing Sheets

EXPRESS COOK FEATURE

BACKGROUND

The present disclosure relates to a method and an apparatus for controlling a cooking appliance that simplifies user input to perform cooking processes.

Cooking appliances with electronic controls generally require multiple actuations and numerous switch manipulations or keypad presses by the user to generate the information for setting up control of the cooking apparatus.

Aspects of the present disclosure include simplifying the conventional controls of standalone microwaves or combination cooking appliances by reducing the number (or count) of keypad touches, including keypad searches, while programming, initiating, and/or adding to a cook time duration.

SUMMARY

In accordance with an aspect of the disclosure, there is provided a control for a cooking apparatus having a plurality of user actuable keypads at least some of which are numeric selectors. An electronic controller having at least one numeric keypad is operative to initiate a cooking operation having a time duration in minutes corresponding to the value associated with the particular numeric keypad selector with a first press. The controller being further operative in response to a second successive actuation of the particular numeric keypad to increase the cook time duration by a first predetermined time increment; and, responsive thereafter during the duration of the initiated cooking operation to the actuation of any of the plurality of keypads to increase the duration of the cooking operation by a second predetermined time increment.

In accordance with another aspect of the disclosure, there is provided a method for controlling a cooking duration. The method comprises providing a set of user actuable keypads for programming a microprocessor wherein the set of keypads includes a group of independent numerical selectors; actuating once one of the numerical selectors of the set of keypads to initiate a cooking duration in minutes; and, actuating again the same one of the numerical selectors to add an additional predetermined amount of time to the cooking duration.

In accordance with still another aspect of the disclosure, there is provided a control for a cooking apparatus having a microprocessor responsive to a set of user actuable keypads. The keypads comprise numeric selectors for initiating a cook time duration in minutes corresponding to the numeric selector with a first actuation. The same numeric selector can add a predetermined amount of time (x) to the cook time duration with a second actuation, wherein the numeric selectors include the numeric values of 1, 2, 3, 4, 5, and 6.

In accordance with yet another aspect of the disclosure, there is provided a method for controlling a cooking duration. The method comprises providing a set of user actuable keypads for programming a microprocessor wherein the set of keypads includes a group of independent numerical selectors; actuating once one of the numerical selectors to initiate a cooking duration in minutes corresponding to the numerical selector value; actuating again the same one of the numerical selectors can add 30 seconds of cooking duration; and thereafter, actuating any one of the numerical selectors can add 15 more seconds of cooking duration with each subsequent actuation for the duration of the selected cooking time.

BRIEF DESCRIPTION OF THE DRAWINGS

The present disclosure will be more fully understood by reference to the following detailed description of embodiments of the present disclosure when read in conjunction with the accompanying drawings in which like reference characters refer to like parts throughout the views, and in which.

DETAILED DESCRIPTION OF THE DISCLOSURE

Figure 1:
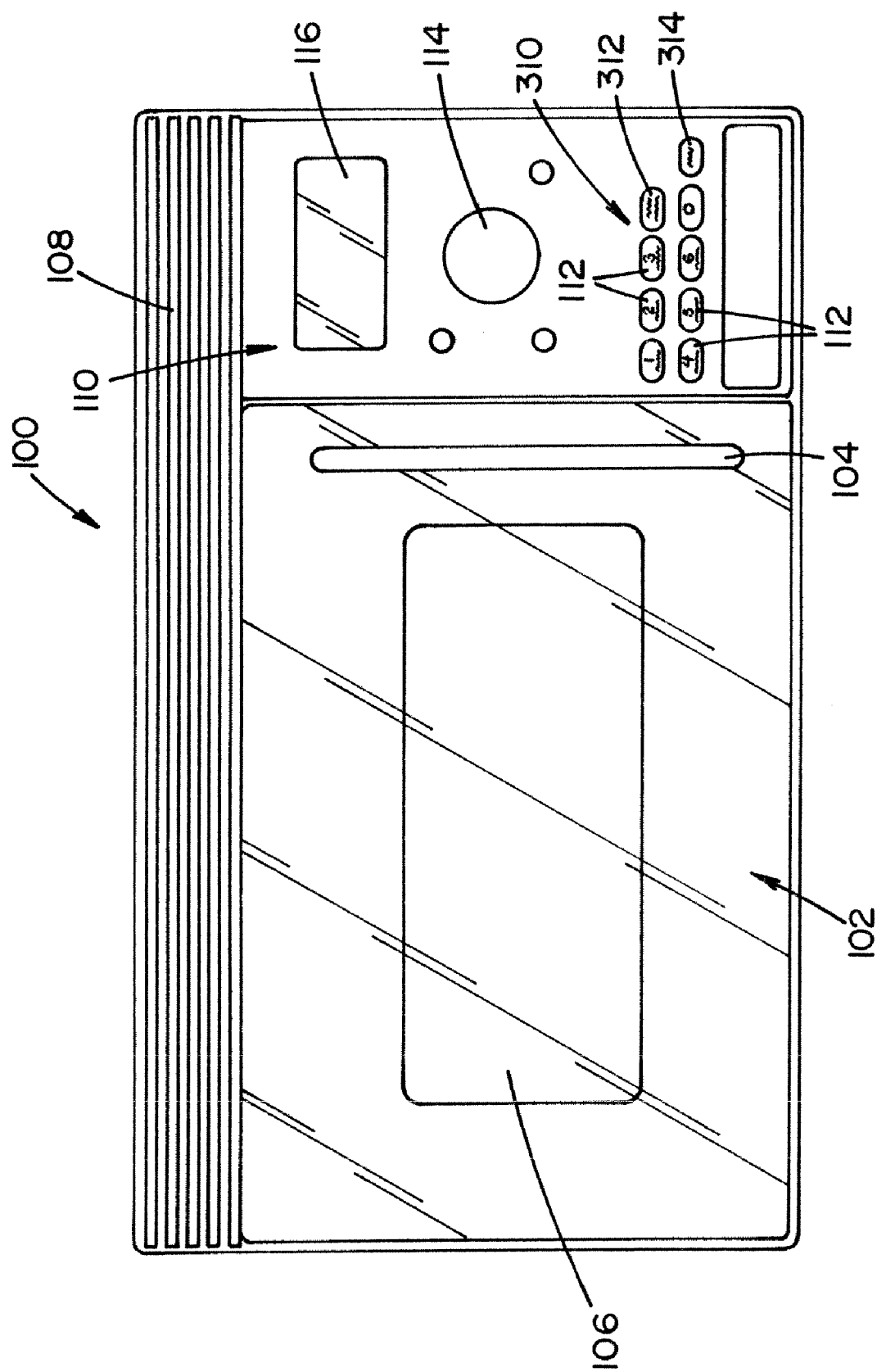
FIG. 1 is a front view of a microwave oven in accordance with one embodiment of the present disclosure; and, FIG. 2 is another embodiment of a portion of a numeric keypad of a microwave oven according to the present disclosure.

FIG. 1 is a front view of an exemplary microwave oven 100 in accordance with one embodiment of the present disclosure. Oven 100 can include a frameless glass door 102 having a handle 104. A window 106 is provided for viewing food in the oven cooking cavity. Door 102 can have an inner metal frame that extends around the door periphery and comprises an RF door choke. The glass of door 102 has, for example, a thickness of about ⅛" (0.32 cm) and can withstand high temperatures and is secured to the inner metal frame by an adhesive. Handle 104 also can be secured to the metal frame by bolts that extend through openings in the glass. Oven 100 also includes an injection molded plastic vent grille 108 and a frameless glass control panel 110.

Panel 110, includes an array of user actuable touch pads or switches 112, which may be mechanical switches or capacitive touch switches or other user actuable devices as is well known in the art. An injection molded knob or dial 114 can be provided for making multiple selections. Selections are made using dial 114 by rotating dial 114 clockwise or counterclockwise and when the desired selection is displayed, pressing dial 114. Instructions and selections are displayed on a liquid crystal display 116.

While the control panel of FIG. 1 can be incorporated as a structural portion of the appliance, it is to be understood the control and the switches actuated by the user may be physically external to the appliance, for example, a universal control for all appliances in a room or building, and may also incorporate remote control technology that does not require a user's presence immediately in front of the appliance.

Figure 2:
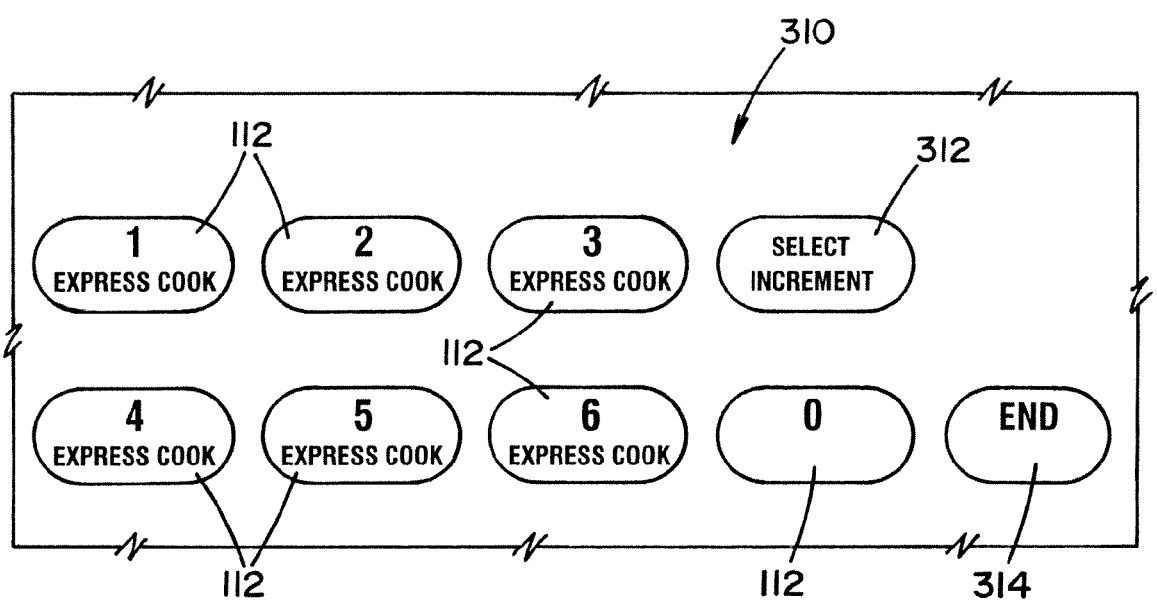

Referring now to FIG. 2, a portion 310 of a control panel 110 of FIG. 1 is therein shown comprising a plurality of user actuable touch keypad switches 112. Each touch keypad can be marked by indicia as shown including numeric or primary keypads 0, 1, 2, 3, 4, 5, and 6. These keypads can have a plurality of functions, in addition to entering numerical data, i.e. express cook functions, to be described in detail hereinafter.

The present disclosure simplifies cook time programming by reducing user chosen selections, i.e. keypad touches. In one exemplary arrangement, the user can initiate a cooking cycle, by an initial actuation of one of the numerical keypads which are numbered #1, #2, #3, #4, #5, and #6 in the illustrative embodiment. The duration of the cooking cycle thus initiated will have an initial duration corresponding to the value of the selected numerical keypad in minutes. The display 116 will initially display the selected time and continue to display the time remaining in the cooking cycle as the cycle progresses. At any time thereafter during the initiated cooking cycle, the user may increase the duration of the cooking cycle by a first predetermined amount by a second actuation of the initially selected keypad. The user may further increase the duration in increments of a second predetermined amount by each subsequent actuation of the same or any other of the numerical keypad. Such adjustments to the cooking time will appear in the cooking time remaining display, For example, the user may initiate operation in the Express Cook mode, that is, in the illustrative embodiment, a mode which immediately begins cooking at a predetermined power level, which in the illustrative embodiment is the maximum selectable power lever, but it could be any predetermined level, and will continue for the duration of the selected time period. The first actuation of one of these numeric keypads will immediately start express cook for 1:00, 2:00, 3:00, 4:00, 5:00 or 6:00 minutes, respectively, corresponding to which numerical keypad is actuated. A second actuation of the same numeric keypad would add a predetermined increment of time, which in this illustrative embodiment is 30 seconds to the cook time. For example, actuation of keypad 1, and then keypad 1 again, would program a cook time of 1:30 A third actuation of the same, or any other numeric keypad would add a second predetermined increment of time, which in the illustrative embodiment is 15 seconds to the cook time. As a further example, actuating keypad 2, 2, and 2 would program a cook time of 2:45. A fourth through nth actuation would continue to add increments of the second predetermined value for each actuation until the maximum cook time was reached, which in the illustrative embodiment is minutes to avoid overly exciting the cooking system, but could be more or less depending on the design parameters of the particular appliance. For example, actuating 6, 6, 6, 6, 6, and 6 would program a cook time duration of 7:30 (7 minutes and 30 seconds). In this example, the cook time duration accumulates as follows: 6:00, 6:30, 6:45, 7:00, 7:15, and 7:30 as each respective numeric keypad is pressed. An equivalent cook time can be programmed by actuating the #6 numeric keypad twice and then any other numeric keypad or primary combinations of keypads four times. Thus actuating, for example, #6 twice and then the following combination: 4-5-3-2, or any other combination of the 1-6 numeric keypads, would result in a cook time of 7 minutes and 30 seconds. The second and third presses of the primary keypads can also be done after initiation of cook time, i.e. after cook time has already begun to count down. In accordance with another embodiment the first predetermined increment of time can be selected by the user to be 10, 20, 30, or 40 seconds, or any other user programmed duration, and the second predetermined increment of time can be a predetermined fraction of the first predetermined increment of time, for example, one-half of the first predetermined increment of time. The purpose for having a second predetermined increment of time is to provide for more precise selection. Thus typically, the second predetermined increment value is less than the first predetermined increment value. Referring again to FIG. 2, a 'select increment' 312 keypad can be user actuated for predetermining a first increment and a second increment. Actuating keypad 312 will result in a blank display requesting an increment of time. The user can then program the first increment, i.e., by actuating the '4' and '0' keypads for a first increment of 40 seconds. The user can then actuate the keypad 312 again to accept the increment and to program a second increment. If user desires a second increment of 20 seconds, the '2' and '0' keypads are actuated. The keypad 312 can then be actuated to accept the second increment, and then an 'end' keypad 314 can be actuated to end the programming of the predeterminable increments. The aforementioned method for entering cook time reduces the number of keypad touches, eliminates visual searching and movement from one numeric keypad to another, thereby allowing the user to enter the cook time without maintaining visual contact with the keypad. The #1-#6 numeric keypads typically use large print and are easier to identify from the other keypads. By using multiple presses of the same numeric keypad, and/or presses of another adjacent or proximal numeric keypad, the user does not have to search the keypad and move the hand from one keypad to another distal keypad. In addition, the user does not have to maintain visual contact with the keypad in order to enter most common cook times. The method as described reduces the searching for specific keypads and requires virtually no movement of the hand thereby enabling very quick and easy programming of ninety plus percent (90+%) of all cook time entries.

The aforementioned arrangement provides for a microwave oven keypad that is simple, fast and easy to use. Since the numeric keypads (i.e. #1-6) can be identified by their placement and large numbers, it is much easier to use for those with poor vision and/or in low light conditions. In the illustrative embodiments herein described, the third and subsequent actuations can be of any of the numeric keypads, however, the controller could similarly be programmed to respond to actuation of other non-numeric keypads that might be provided on the control panel without departing from the present disclosure.

Having thus described the present disclosure, many modifications will become apparent to those skilled in the art to which it pertains without departing from the scope and spirit of the present disclosure as defined in the appended claims.

The invention claimed is:

1. A method for controlling a cooking duration, comprising:
    providing a set of tactile keypads for programming a microprocessor wherein said set of tactile keypads includes a group of independent numerical selectors;
    pressing once one of said numerical selectors of said set of tactile keypads to immediately initiate a first cooking duration in minutes; and,
    pressing again same said one of said numerical selectors to add thirty seconds of cooking duration thereby initiating a second cook time duration during said first cook time duration.

2. A method for controlling a cooking duration, comprising:
    providing a set of tactile keypads for programming a microprocessor wherein said set of tactile keypads includes a group of independent numerical selectors;
    pressing once one of said numerical selectors of said set of tactile keypads to initiate a cooking duration in minutes;
    pressing again same said one of said numerical selectors to add (x) seconds of cooking duration; and,
    pressing any one of said numerical selectors to add ½ (x) seconds of cooking duration.

3. The method for controlling a cooking duration according to claim 2, further comprising:
    pressing said any one of said numerical selectors to add another ½ (x) seconds of cooking duration.

4. The method for controlling a cooking duration according to claim 2, further comprising:
    wherein said group of numerical selectors is selected from the group consisting of tactile numeric keypads 1, 2, 3, 4, 5, and 6.

5. A control for a cooking apparatus having a microprocessor responsive to a set of tactile keypads, the control comprising:
    a numeric selector for initiating a cook time duration in minutes corresponding to the numeric selector with a first press;
    same said numeric selector adding (x) time in seconds to said cook time duration with a second press;
    said numeric selector is selected from the group consisting of 1, 2, 3, 4, 5, and 6; and, wherein any numeric selector adding ½ (x) time in seconds to said cook time duration with a third press.

6. The control according to claim 5, wherein said (x) time is selected from the group consisting of 10, 20, 30, and 40 seconds.

7. The control according to claim 5, wherein said (x) time is 30 seconds.

8. The control according to claim 5, wherein said (x) time is 20 seconds.

9. A control for a cooking apparatus having a microprocessor responsive to a set of tactile keypads, the control comprising:
 a numeric selector for initiating a cook time duration in minutes corresponding to the numeric selector with a first press;
 same said numeric selector adding (x) time in seconds to said cook time duration with a second press;
 said numeric selector is selected from the group consisting of 1, 2, 3, 4, 5, and 6; and,
 wherein said any numeric selector adding ½ (x) time in seconds to said cook time duration with every third and subsequent press.

10. A method for controlling a cooking duration, comprising:
 providing a set of tactile keypads for programming a microprocessor wherein said set of tactile keypads includes a group of independent numerical selectors;
 wherein said group of numerical selectors is selected from the group consisting of numbers 1, 2, 3, 4, 5, and 6;
 pressing once one of said numerical selectors of said set of tactile keypads to immediately initiate a first cooking duration in minutes corresponding to said numerical selector;
 pressing again same said one of said numerical selectors to add 30 seconds of cooking duration to said first cooking duration; and,
 pressing any one of said numerical selectors to add another 15 seconds of cooking duration to said first cooking duration.

11. The method for controlling a cooking duration according to claim 10, further comprising:
 pressing said any one of said numerical selectors to add another 15 seconds of cooking duration.

* * * * *